(12) United States Patent
Hsu

(10) Patent No.: US 8,217,559 B2
(45) Date of Patent: Jul. 10, 2012

(54) SINGLE CHIP MULTICOLOR PACKAGE

(75) Inventor: Chia-Liang Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 408 days.

(21) Appl. No.: 12/628,546

(22) Filed: Dec. 1, 2009

(65) Prior Publication Data
US 2010/0133999 A1 Jun. 3, 2010

(30) Foreign Application Priority Data

Dec. 1, 2008 (TW) ................................ 97146711 A

(51) Int. Cl.
*H05B 33/02* (2006.01)
*H05B 33/04* (2006.01)
*H05B 33/14* (2006.01)
*H05B 33/22* (2006.01)

(52) U.S. Cl. .......... 313/113; 313/501; 362/84; 362/510; 362/231; 362/293; 257/89; 257/98

(58) Field of Classification Search .......... 313/110–113, 313/498–512; 362/609, 611–612, 623, 215, 362/217.05, 296.01, 301, 327, 583, 293, 362/84, 510, 231, 242; 257/98, E33.072, 89, 100, 431–448; 445/25, 28, 58
See application file for complete search history.

(56) References Cited

U.S. PATENT DOCUMENTS
2012/0012872 A1* 1/2012 Shen et al. ...................... 257/98
* cited by examiner

*Primary Examiner* — Anne Hines
*Assistant Examiner* — Jose M Diaz
(74) *Attorney, Agent, or Firm* — Muncy, Geissler, Olds & Lowe, PLLC

(57) ABSTRACT

An opto-electronic device package structure for multicolor light is disclosed. The package structure comprises a transparent carrier, a circuit layer on the transparent carrier, an opto-electronic device emitting the light of the first wavelength and is electrically connecting with the circuit layer on the transparent carrier, a first wavelength conversion structure on the lateral side of the opto-electronic device, a reflective layer on the first wavelength conversion structure, and a transparent material for package on the reflective layer and on the opto-electronic device.

13 Claims, 8 Drawing Sheets

SINGLE CHIP MULTICOLOR PACKAGE

CROSS REFERENCE TO RELATED APPLICATIONS

This application claims the right of priority based on Taiwan Patent Application No. 097146711 entitled "Multicolor Package with Single Chip", filed Dec. 1, 2008, which is incorporated herein by reference and assigned to the assignee herein.

TECHNICAL FIELD

The present application generally relates to an opto-electronic device package structure and the manufacturing method thereof, and more particularly to an opto-electronic device package structure with single chip for multicolor light and the manufacturing method thereof.

BACKGROUND

As the light-emitting diode technology evolves rapidly in recent years, the efficiency has improved faster than expected. As the price per brightness unit keeps dropping, the application of light-emitting diode in the illumination field can be expected soon. The illumination application has various requirements and includes mainly the outdoor landscape decoration or indoor illumination. People are impressed by light emitting diode because of its colorfulness. How to make use of the advantages of the light-emitting diode in design of the traditional illumination design effectively is a key point for the light-emitting diode entering the illumination application.

Generally speaking, to exhibit the colorfulness, an arrangement of multicolor chips is preferred which requires more chips and more complicated circuit design. The cost is therefore higher and slows down the application of light emitting diode.

SUMMARY

The present application provides an opto-electronic device package structure with single chip emitting multicolor light and comprising a transparent carrier and a circuit layer formed on the first surface of the transparent carrier.

The present application provides an opto-electronic device package structure for multicolor light comprising an opto-electronic device with single chip emitting light of first wavelength on the first surface of the transparent carrier and electrically connecting with the circuit layer.

The present application provides an opto-electronic device package structure emitting multicolor light wherein the light of the first wavelength is blue light.

The present application provides an opto-electronic device package structure for multicolor light comprising an opto-electronic device in single chip form and a first wavelength conversion structure on the lateral side of the opto-electronic device wherein the first wavelength conversion structure converts the light of the first wavelength emitting from the lateral side of the opto-electronic device into the light of the second wavelength.

The present application provides an opto-electronic device package structure emitting multicolor light wherein the light of the second wavelength is white light.

The present application provides an opto-electronic device package structure for multicolor light comprising a reflective layer on the first wavelength conversion structure. The light of the second wavelength is reflected to the first wavelength conversion structure by the reflective layer and emitted from the second surface of the transparent carrier.

The present application provides an opto-electronic device package structure for multicolor light comprising a transparent material for package on the reflective layer and the opto-electronic device for the light of the first wavelength passing through the transparent material for package.

The present application provides an opto-electronic device package structure for multicolor light comprising a second wavelength conversion structure among the reflective layer, the opto-electronic device, and the transparent material for package. The light of the first wavelength emitting from the opto-electronic device is converted into light of the third wavelength by the second wavelength conversion structure.

The present application provides an opto-electronic device package structure for multicolor light wherein the light of the first wavelength is ultraviolet light, and the light of the third wavelength is blue light.

The present application provides an opto-electronic device package structure for multicolor light to form an optical device module emitting multicolor light.

The present application provides an opto-electronic device package structure for multicolor light to form an outdoor display which shows information at two sides.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF THE PREFERRED EMBODIMENTS

The present application discloses an opto-electronic device package structure for multicolor light and the manufacturing method thereof.

Figure 1:
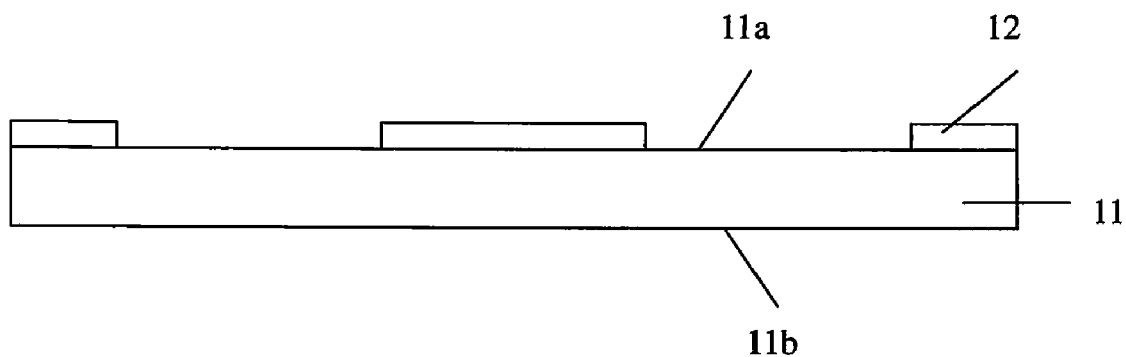
FIGS. 1-6 illustrate a process flow of forming an opto-electronic device package structure with single chip 100 in accordance with one embodiment of the present application.
Figure 2:
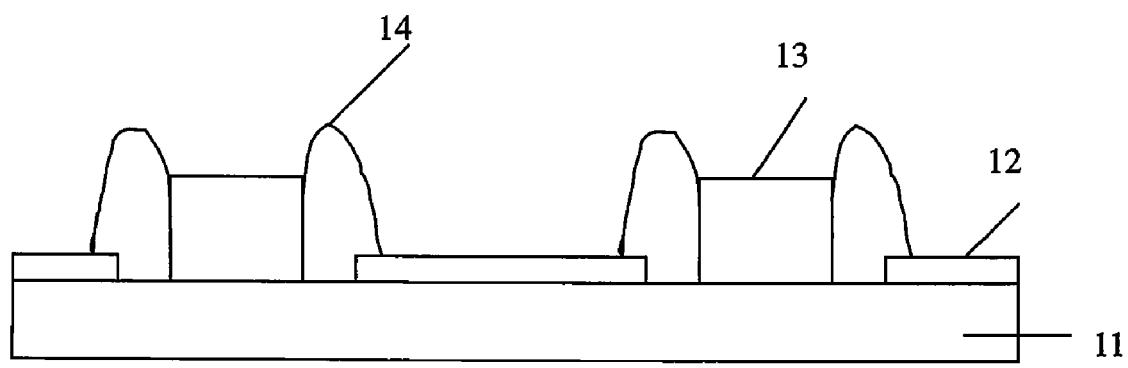
Figure 3:
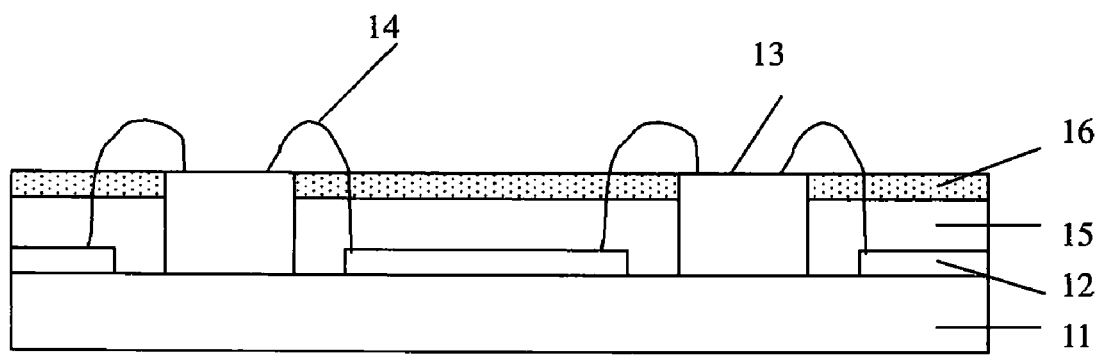
Figure 4:
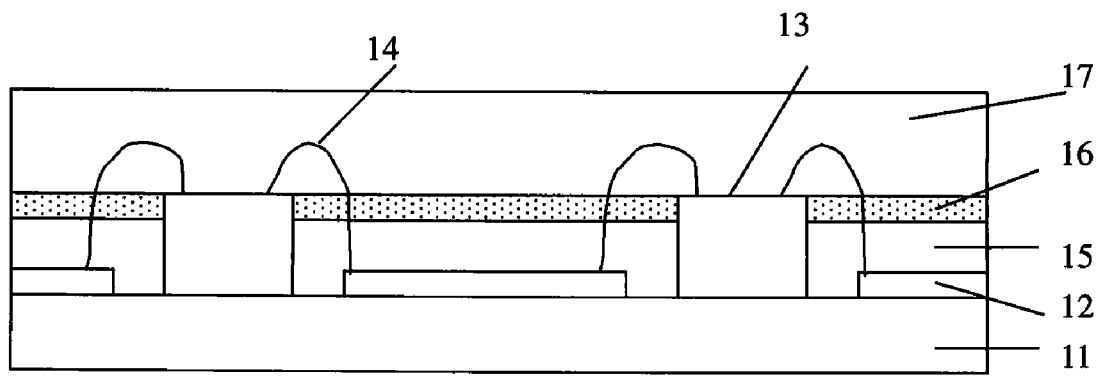
Figure 5:
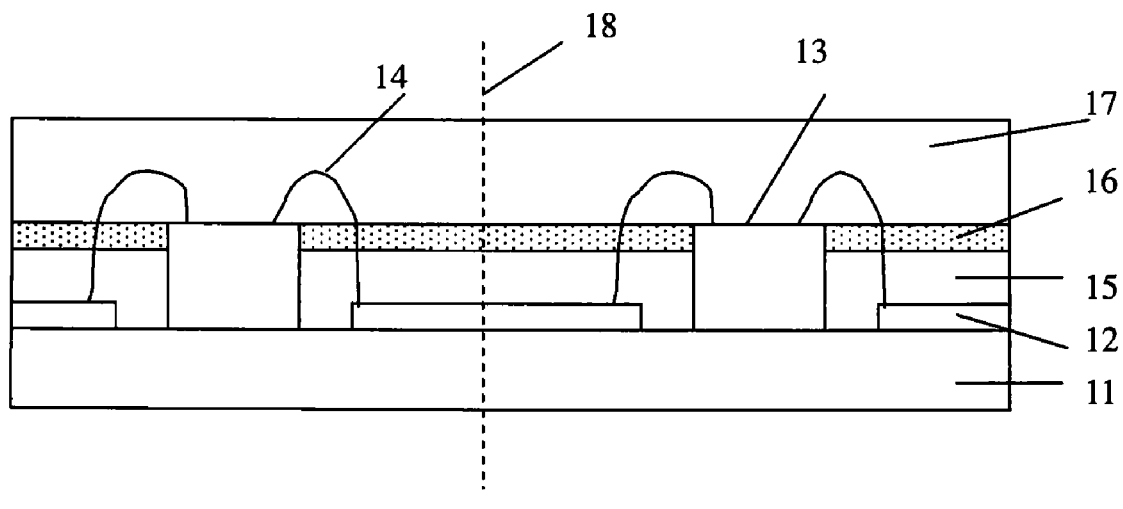
Figure 6:
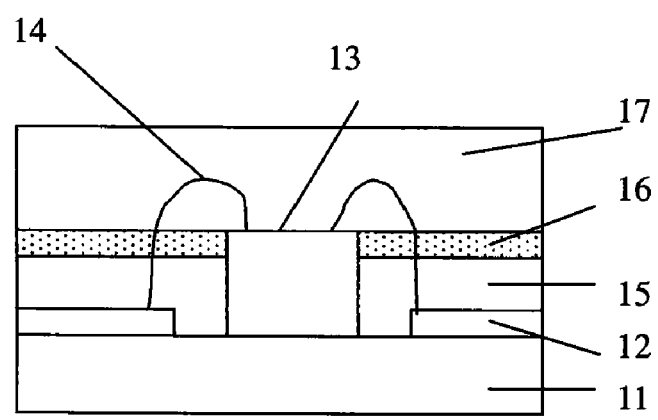
Figure 7:
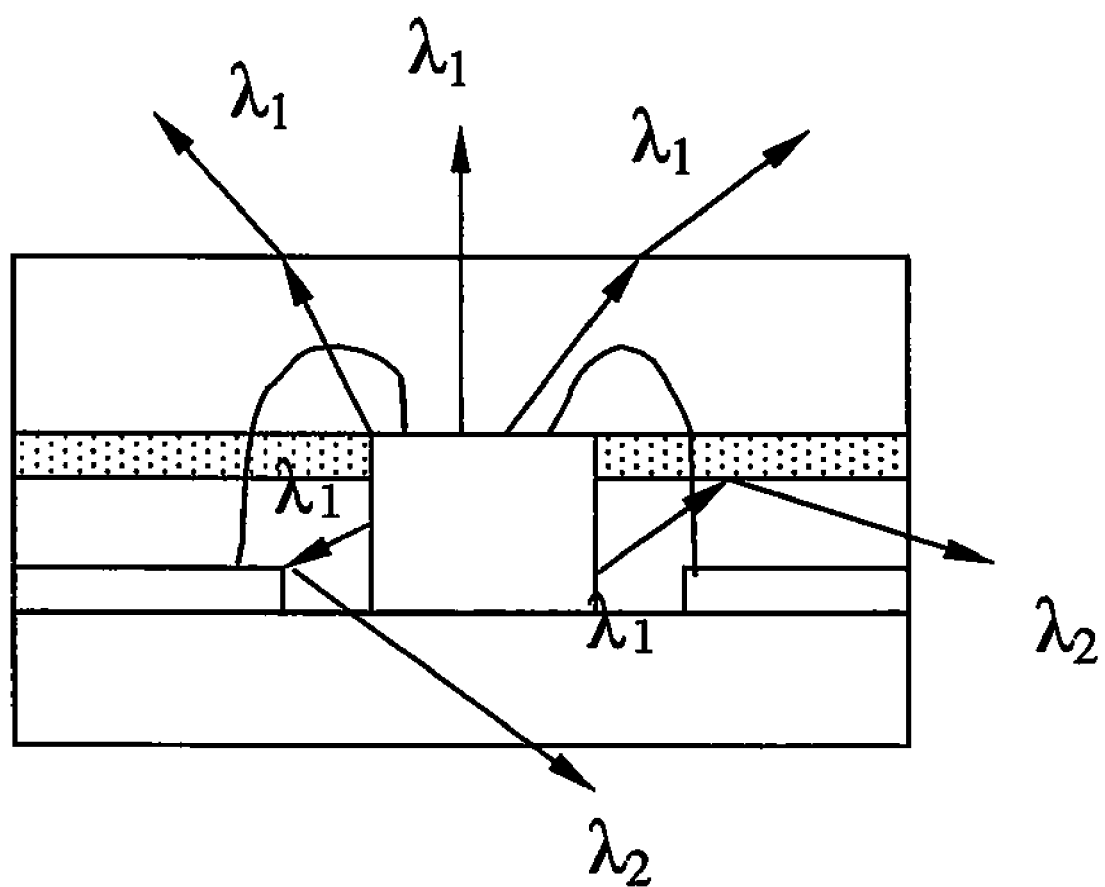
FIG. 7 illustrates a light emitting diagram from an opto-electronic device package structure with single chip 100 in accordance with one embodiment of the present application.

FIGS. 1-6 illustrate a process flow of forming an opto-electronic device package structure for multicolor light with single chip 100 in accordance with the first embodiment of the present application. Referring to FIG. 1, a transparent carrier 11 having a first surface 11a and a second surface 11b is provided, and a circuit layer 12 is formed on the first surface 11a of the transparent carrier. A blue light-emitting diode 13 formed as a single chip with a transparent substrate is formed on the first surface 11a of the transparent carrier 11. The blue light-emitting diode is electrically connected with the circuit layer 12 by an electrically connecting mechanism 14, as FIG. 2 shows. A first wavelength conversion structure 15 is formed on the lateral side of the blue light-emitting diode, and a reflective layer 16 is formed on the first wavelength conversion structure 15, as FIG. 3 shows. The first wavelength conversion structure 15 converts the blue light emitting from the lateral side of the blue light-emitting diode into the white light, and the white light is reflected by the reflective layer 16 and emitted from the second surface 11b of the transparent carrier. A transparent material for package 17 is formed on the reflective layer 16 and on the blue light-emitting diode 13, wherein the light of the first wavelength from the blue light-emitting diode passes through the transparent material for package, as FIG. 4 shows. A dicing channel 18 is formed from the transparent material for package 17 to the transparent carrier 11, as FIG. 5 shows. The plurality of opto-electronic device package structures for multicolor light with single chip 100 is formed by dicing along the dicing channel 18, as FIG. 6 shows. FIG. 7 is a light emitting diagram of an opto-electronic device package structure for multicolor light 100.

Figure 8:
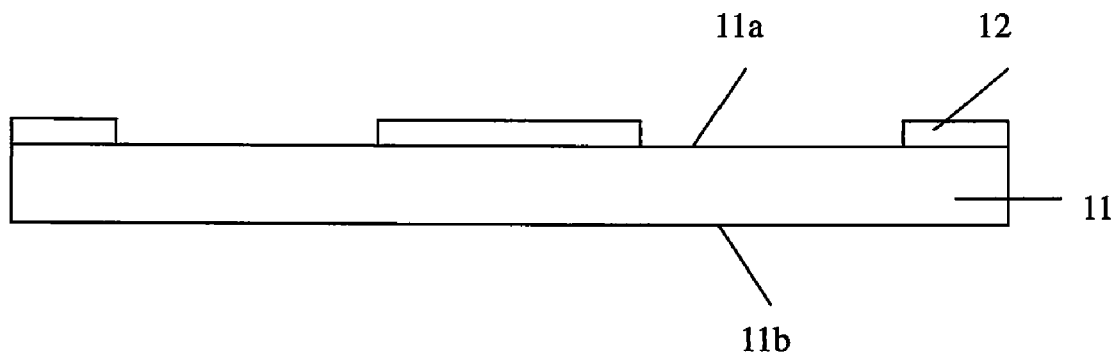
FIGS. 8-14 illustrate a process flow of forming an opto-electronic device package structure with single chip 200 in accordance with another embodiment of the present application.
Figure 9:
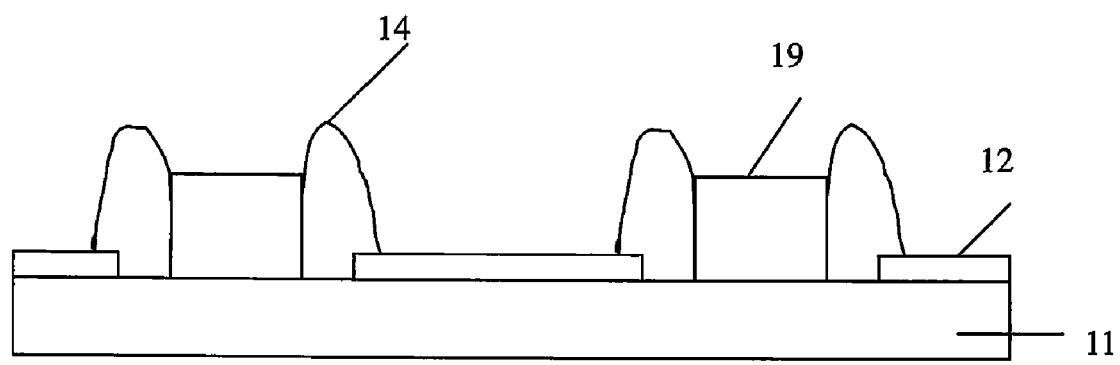
Figure 10:
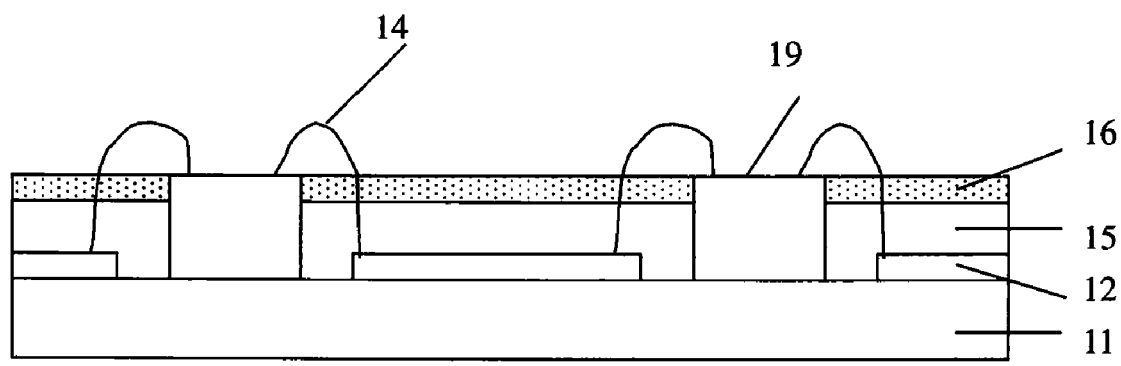
Figure 11:
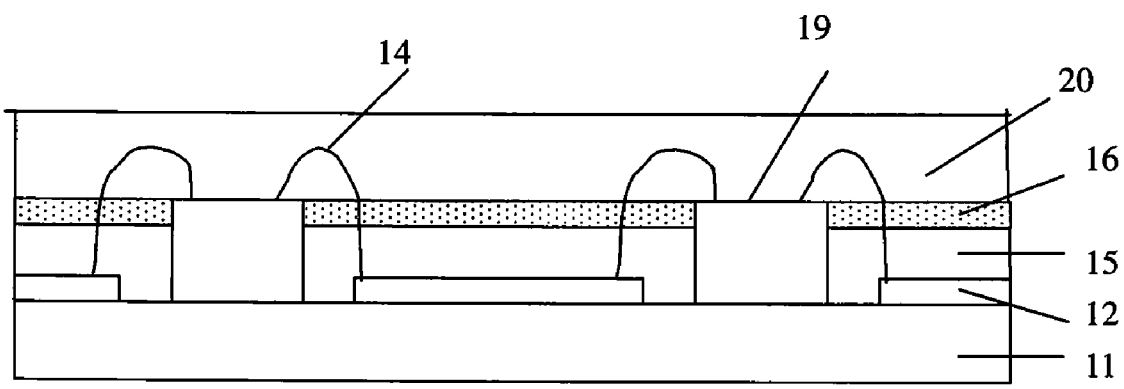
Figure 12:
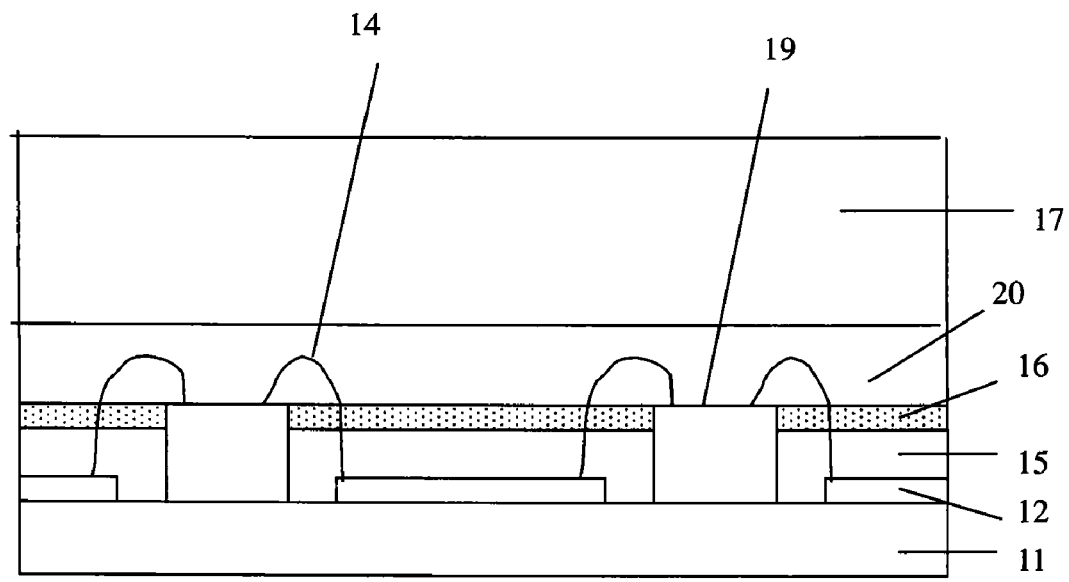
Figure 13:
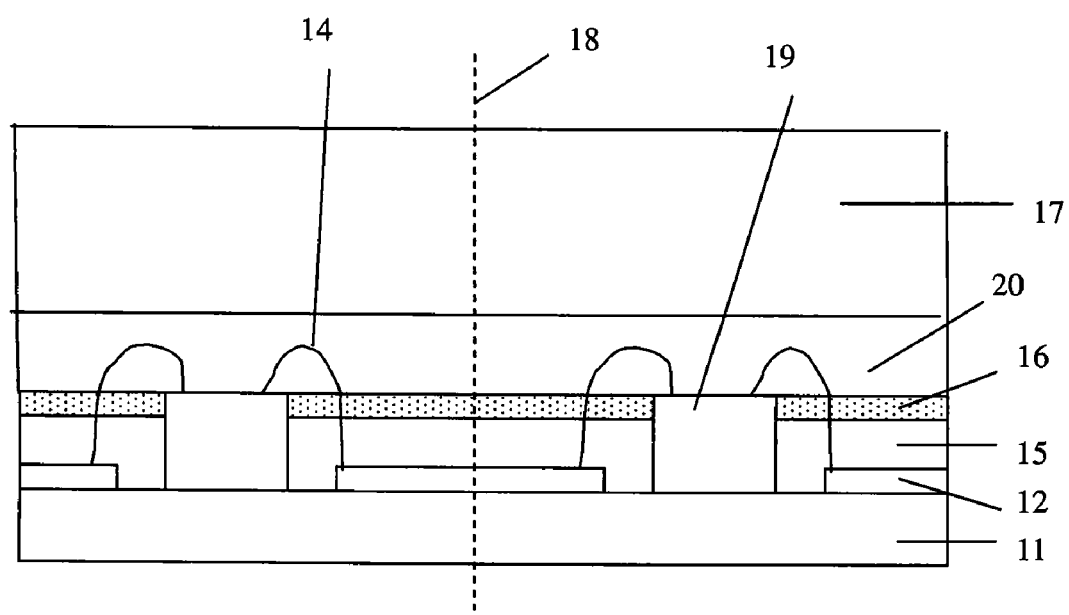
Figure 14:
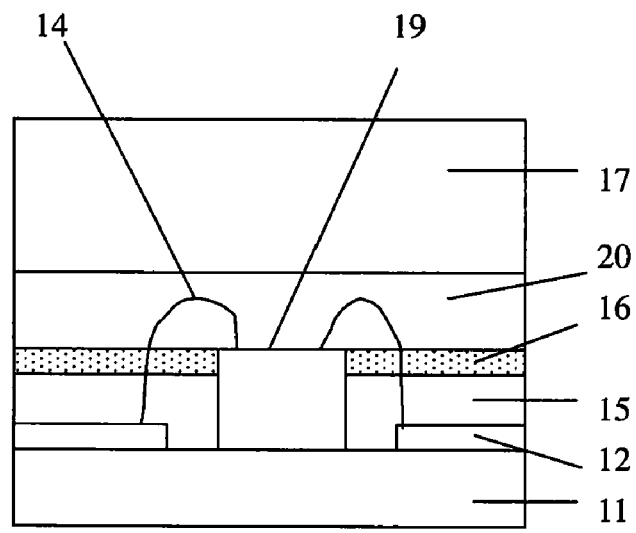
Figure 15:
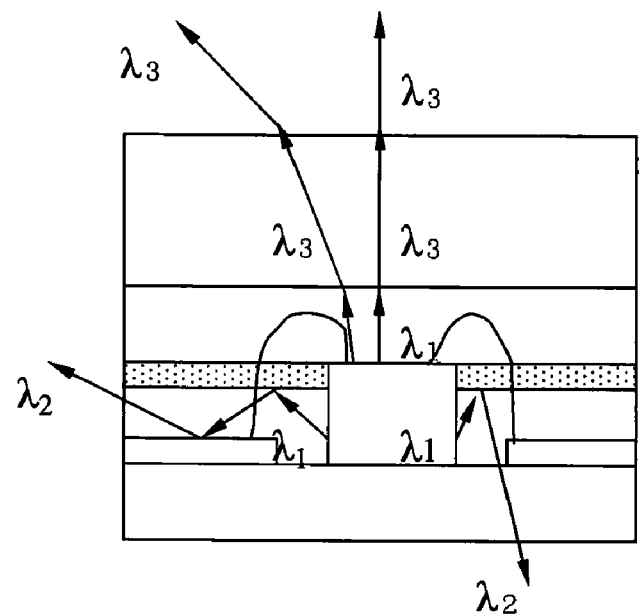
FIG. 15 illustrates a light emitting diagram from an opto-electronic device package structure with single chip 200 in accordance with another embodiment of the present application.

FIGS. 8-14 illustrate a process flow of forming an opto-electronic device package structure for multicolor light with single chip 200 in accordance with the second embodiment of the present application. Referring to FIG. 8, a transparent carrier 11 having a first surface 11a and a second surface 11b is provided, and a circuit layer 12 is formed on the first surface 11a of the transparent carrier. An ultraviolet light-emitting diode 19 formed as a single chip with a transparent substrate is formed on the first surface 11a of the transparent carrier 11. The ultraviolet light-emitting diode is electrically connected with the circuit layer 12 by an electrically connecting mechanism 14, as FIG. 9 shows. A first wavelength conversion structure 15 is formed on the lateral side of the ultraviolet light-emitting diode, and a reflective layer 16 is formed on the first wavelength conversion structure 15, as FIG. 10 shows. The first wavelength conversion structure 15 converts the ultraviolet light emitting from the lateral side of the ultraviolet light-emitting diode into the white light, and the white light is reflected by the reflective layer 16 and emitted from the second surface 11b of the transparent carrier. A second wavelength conversion structure 20 is formed on the reflective layer 16 and on the ultraviolet light-emitting diode 19, as FIG. 11 shows. A transparent material for package 17 is formed on the second wavelength conversion structure 20 as shown in FIG. 12. The ultraviolet light from the ultraviolet light-emitting diode 19 is converted into blue light by the second wavelength conversion structure 20 and is emitted through the transparent material for package. A dicing channel 18 is formed from the transparent material for package 17 to the transparent carrier 11 as shown in FIG. 13. The plurality of opto-electronic device package structures for multicolor light with single chip 200 are formed by dicing along the dicing channel 18, as FIG. 14 shows. FIG. 15 is a light emitting diagram of an opto-electronic device package structure for multicolor light 200.

The present application provides the opto-electronic device package structures for multicolor light with opto-electronic device such as single chip 100 or 200, and an opto-electronic device module for multicolor light contains such package structure. An outdoor display showing the information at two sides can also be formed by the opto-electronic device module for multicolor light.

Other embodiments of the present application will be apparent to those having ordinary skills in the art from consideration of the specification and practice of the invention disclosed herein. It is intended that the specification and examples be considered as exemplary only, with a true scope and spirit of the invention being indicated by the following claims.

I claim:

1. An opto-electronic device package structure emitting multicolor light, comprising:
    a transparent carrier having a first surface and a second surface;
    a circuit layer on the first surface of the transparent carrier;
    an opto-electronic device emitting light of a first wavelength and is electrically connecting with the circuit layer on the transparent carrier;
    a first wavelength conversion structure on the lateral side of the opto-electronic device, wherein the first wavelength conversion structure converting the light of the first wavelength emitting from the lateral side of the opto-electronic device into light of a second wavelength;
    a reflective layer on the first wavelength conversion structure, wherein the light of the second wavelength is reflected to the first wavelength conversion structure by the reflective layer and emitted from the second surface of the transparent carrier; and
    a transparent material for package on the reflective layer and on the opto-electronic device for the light of the first wavelength passing through the transparent material for package.

2. The opto-electronic device package structure according to claim 1, wherein the first wavelength light is blue light.

3. The opto-electronic device package structure according to claim 1, wherein the second wavelength light is white light.

4. An opto-electronic device package structure emitting multicolor light, comprising:
    a transparent carrier having a first surface and a second surface;
    a circuit layer on the first surface of the transparent carrier;
    an opto-electronic device emitting light of a first wavelength and is electrically connecting with the circuit layer on the transparent carrier;
    a first wavelength conversion structure on the lateral side of the opto-electronic device, wherein the first wavelength conversion structure converting the light of the first wavelength emitting from the lateral side of the opto-electronic device into light of a second wavelength;
    a reflective layer on the first wavelength conversion structure, wherein the light of the second wavelength is reflected to the first wavelength conversion structure by the reflective layer and emitted from the second surface of the transparent carrier;
    a second wavelength conversion structure on the reflective layer and on the opto-electronic device, wherein the light of the first wavelength emitting from the opto-electronic device is converted into light of a third wavelength by the second wavelength conversion structure; and
    a transparent material for package on the second wavelength conversion structure for the light of the third wavelength passing through the transparent material for package.

5. The opto-electronic device package structure according to claim 4, wherein the first wavelength light is ultraviolet light.

6. The opto-electronic device package structure according to claim 4, wherein the second wavelength light is white light.

7. The opto-electronic device package structure according to claim 4, wherein the third wavelength light is blue light.

8. The opto-electronic device package structure according to claim 1, wherein the opto-electronic device is in a single chip form.

9. The opto-electronic device package structure according to claim 4, wherein the opto-electronic device is in a single chip form.

10. An opto-electronic device module for multicolor light comprising an opto-electronic device package structure according to claim 1.

11. A display showing information at two sides comprising an opto-electronic device package structure according to claim 1.

12. An opto-electronic device module for multicolor light comprising an opto-electronic device package structure according to claim 4.

13. A display showing information at two sides comprising an opto-electronic device package structure according to claim 4.

* * * * *